(12) United States Patent
Gaul et al.

(10) Patent No.: US 11,742,350 B2
(45) Date of Patent: Aug. 29, 2023

(54) METAL GATE N/P BOUNDARY CONTROL BY ACTIVE GATE CUT AND RECESS

(71) Applicant: International Business Machines Corporation, Armonk, NY (US)

(72) Inventors: Andrew Gaul, Halfmoon, NY (US); Chanro Park, Clifton Park, NY (US); Julien Frougier, Albany, NY (US); Ruilong Xie, Niskayuna, NY (US); Andrew M. Greene, Slingerlands, NY (US); Christopher J. Waskiewicz, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 17/482,504

(22) Filed: Sep. 23, 2021

(65) Prior Publication Data
US 2023/0086785 A1     Mar. 23, 2023

(51) Int. Cl.
*H01L 27/092* (2006.01)
*H01L 21/8238* (2006.01)

(52) U.S. Cl.
CPC .... *H01L 27/092* (2013.01); *H01L 21/823842* (2013.01); *H01L 21/823878* (2013.01)

(58) Field of Classification Search
CPC .......... H01L 27/092; H01L 21/823842; H01L 21/823878
See application file for complete search history.

(56) References Cited

U.S. PATENT DOCUMENTS

| | | | |
|---|---|---|---|
| 8,703,595 B2 | 4/2014 | Chuang et al. | |
| 8,881,084 B2 | 11/2014 | Shen et al. | |
| 9,064,932 B1 | 6/2015 | Pham et al. | |
| 9,537,007 B2 | 1/2017 | Yang et al. | |
| 9,608,086 B2 | 3/2017 | Wei et al. | |
| 9,679,985 B1 | 6/2017 | Wu et al. | |
| 9,853,112 B2 | 12/2017 | Liu et al. | |
| 9,911,736 B1 | 3/2018 | Zang et al. | |
| 10,177,041 B2 | 1/2019 | Xie et al. | |
| 10,553,700 B2 | 2/2020 | Bao et al. | |
| 10,665,512 B2 | 5/2020 | Zhou et al. | |
| 2017/0084723 A1 | 3/2017 | Greene et al. | |
| 2017/0148682 A1 | 5/2017 | Basker et al. | |
| 2021/0272957 A1* | 9/2021 | Lee | H01L 27/0924 |
| 2022/0173097 A1* | 6/2022 | Yang | H01L 27/0886 |

\* cited by examiner

*Primary Examiner* — Karen Kusumakar
*Assistant Examiner* — Adam S Bowen
(74) *Attorney, Agent, or Firm* — Cantor Colburn LLP; L. Jeffrey Kelly

(57) ABSTRACT

Embodiments of the present invention are directed to fabrication methods and resulting structures that provide metal gate N/P boundary control in an integrated circuit (IC) using an active gate cut and recess processing scheme. In a non-limiting embodiment of the invention, a gate cut is formed in an N/P boundary between an n-type field effect transistor (FET) and a p-type FET. A first portion of a first work function metal is removed over a channel region of the n-type FET. The gate cut prevents etching a second portion of the first work function metal. The first portion of the first work function metal is replaced with a second work function metal. The gate cut is recessed, and a conductive region is formed on the recessed surface of the gate cut. The conductive region provides electrical continuity across the N/P boundary.

18 Claims, 11 Drawing Sheets

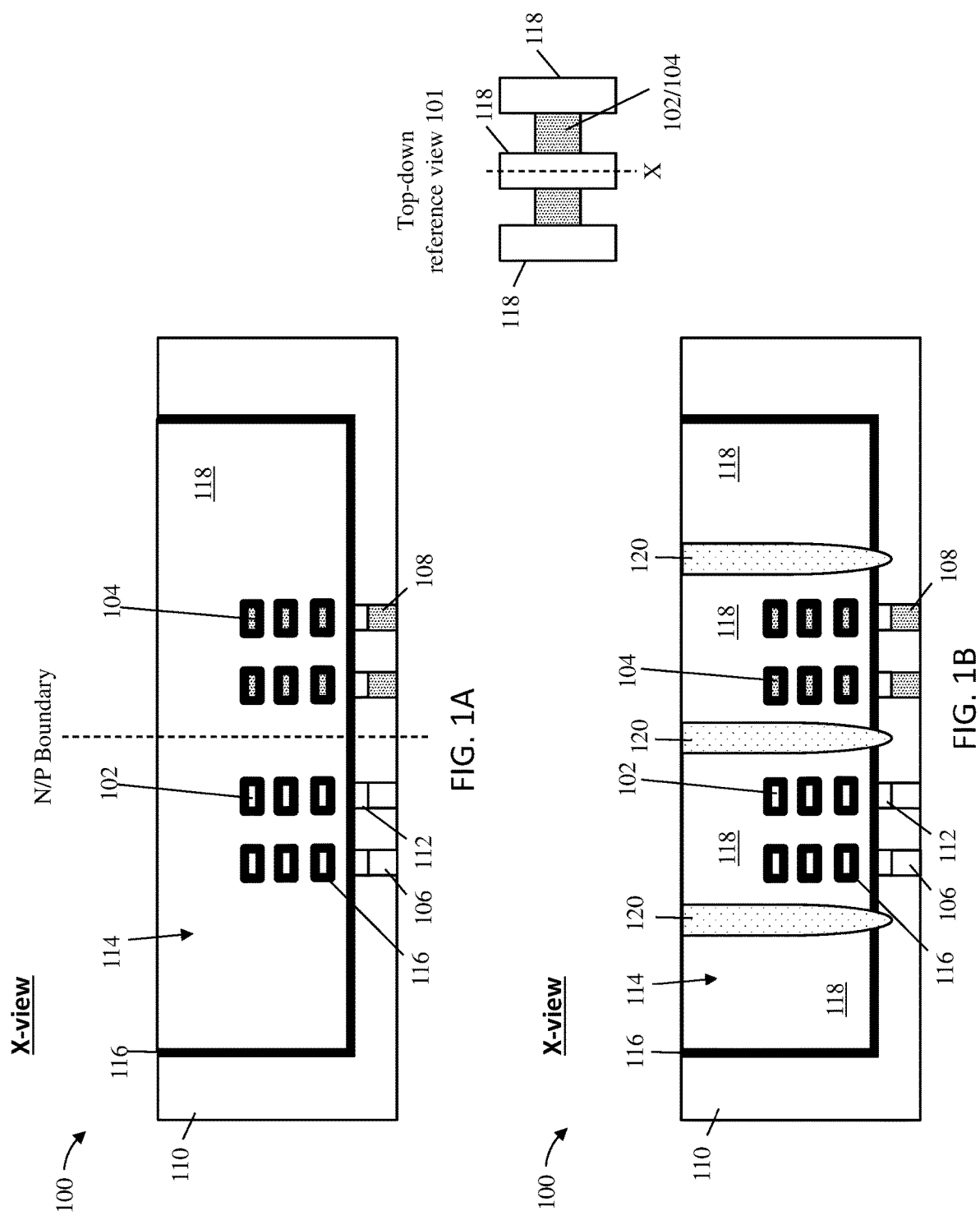

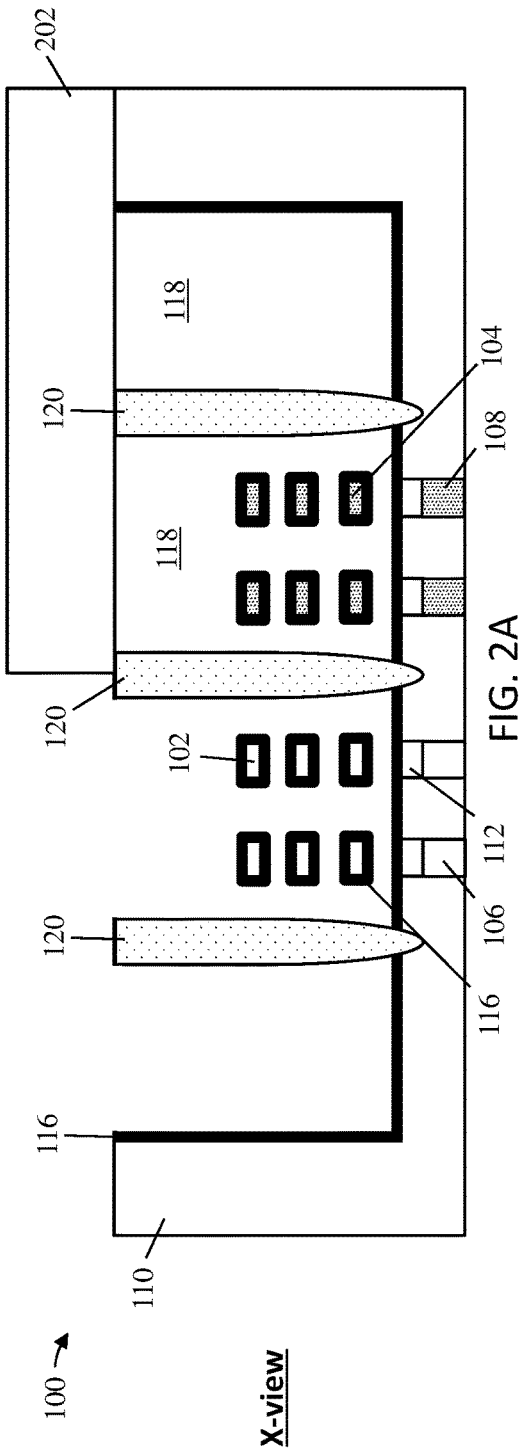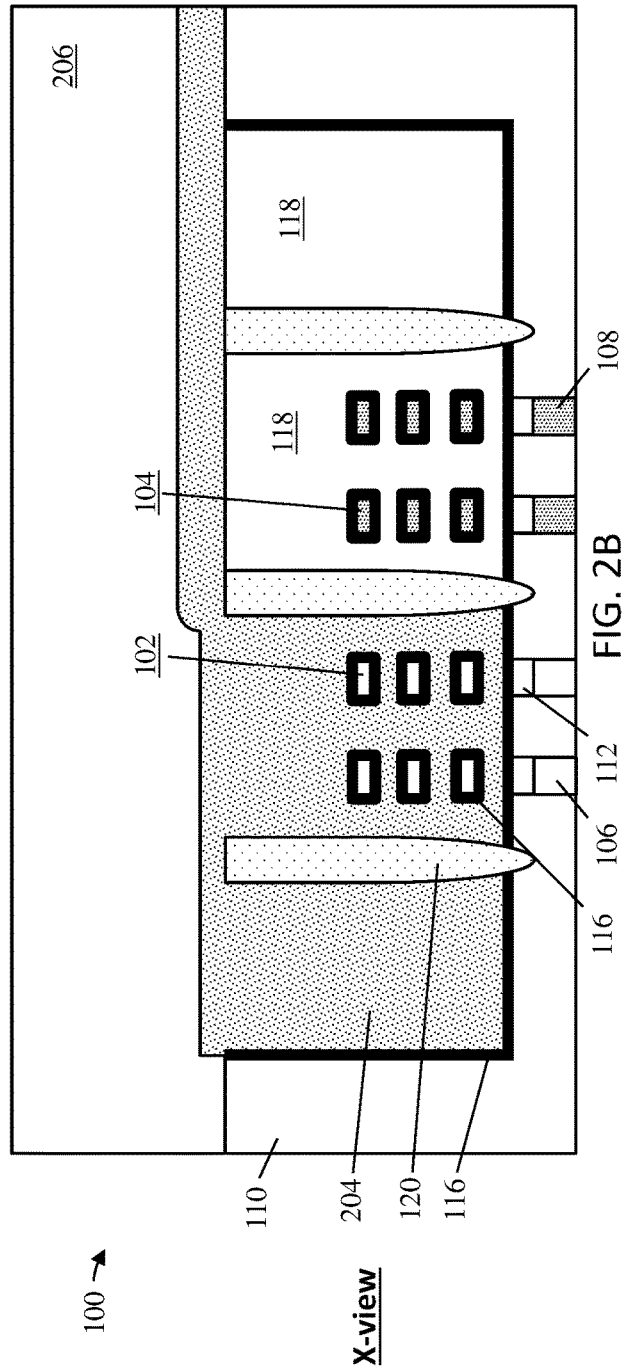
FIG. 2A
FIG. 2B

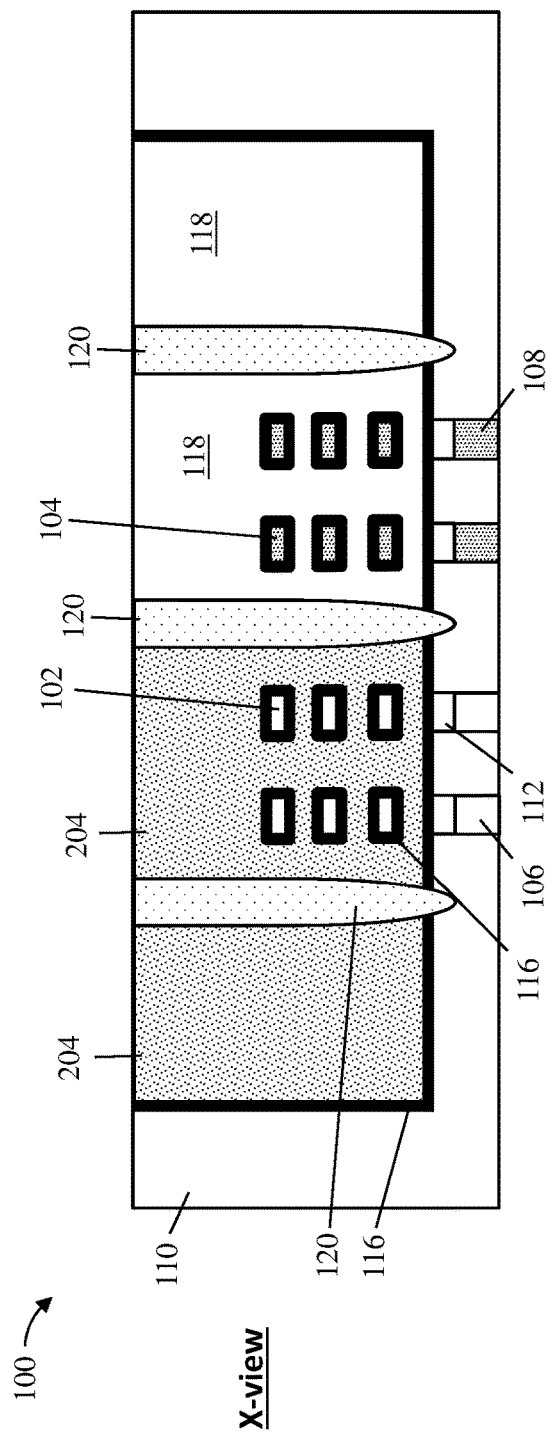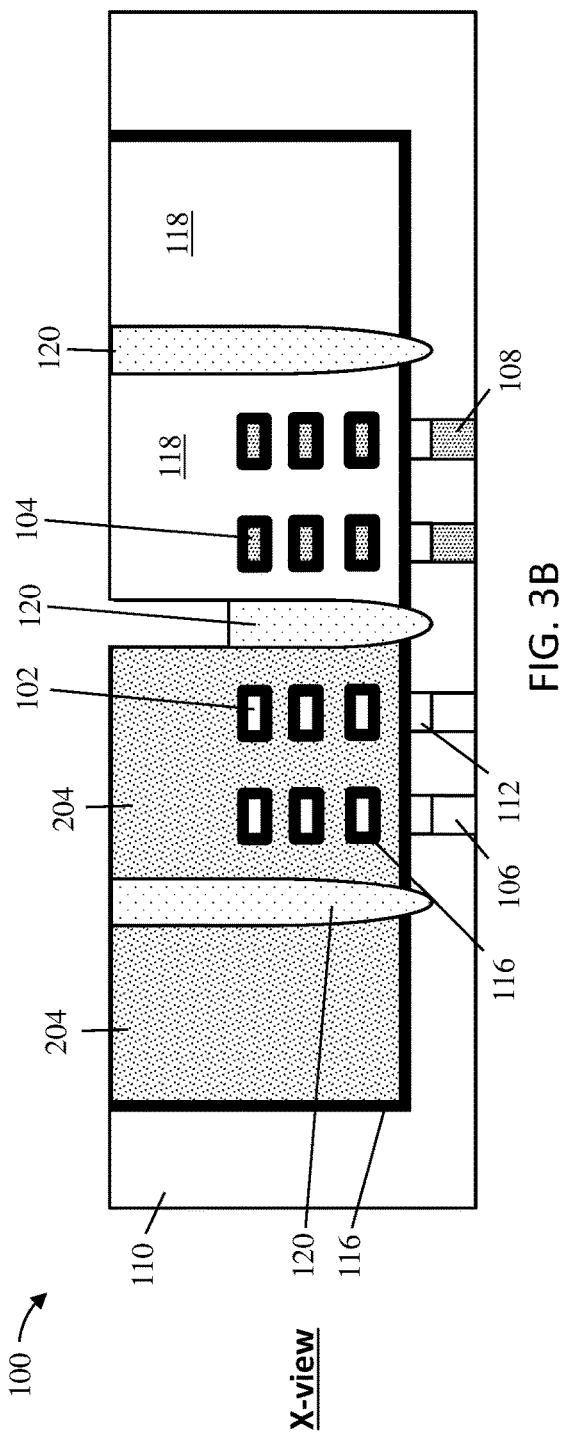

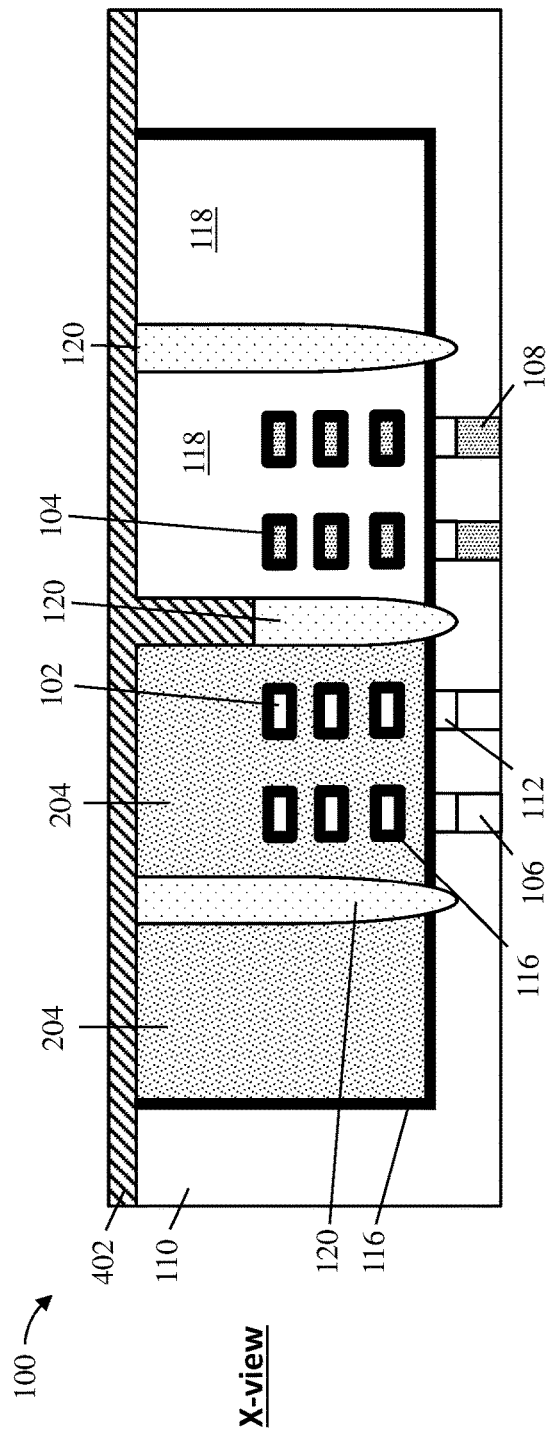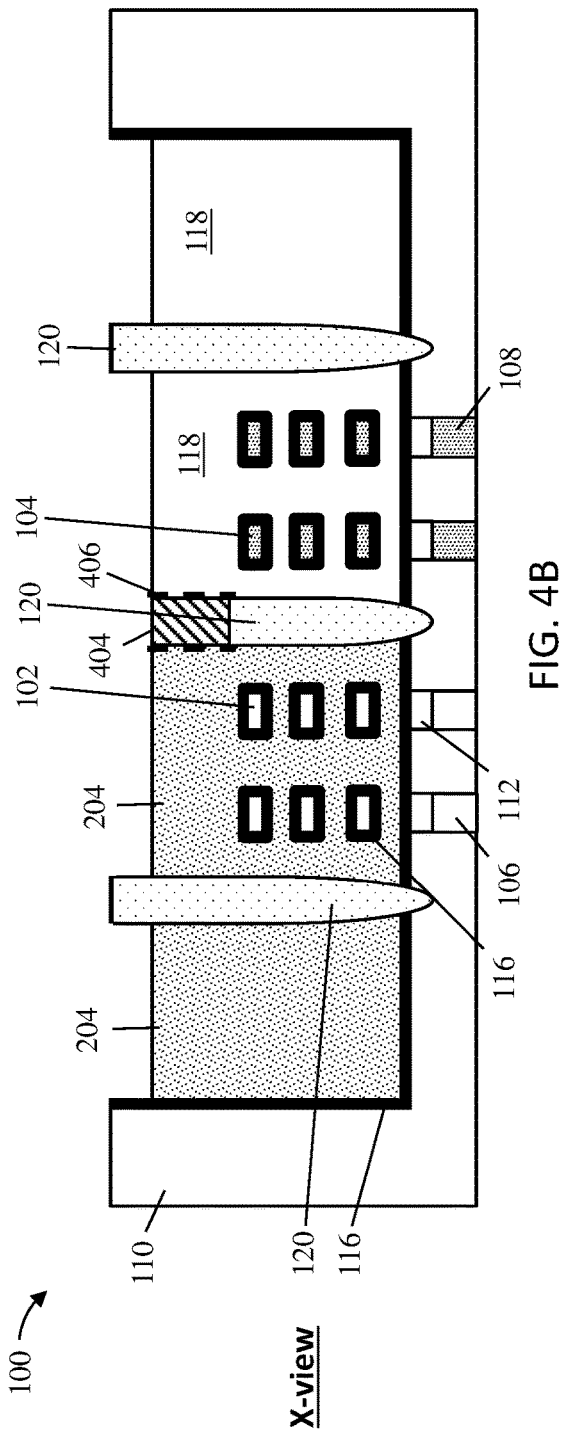
FIG. 4A
FIG. 4B

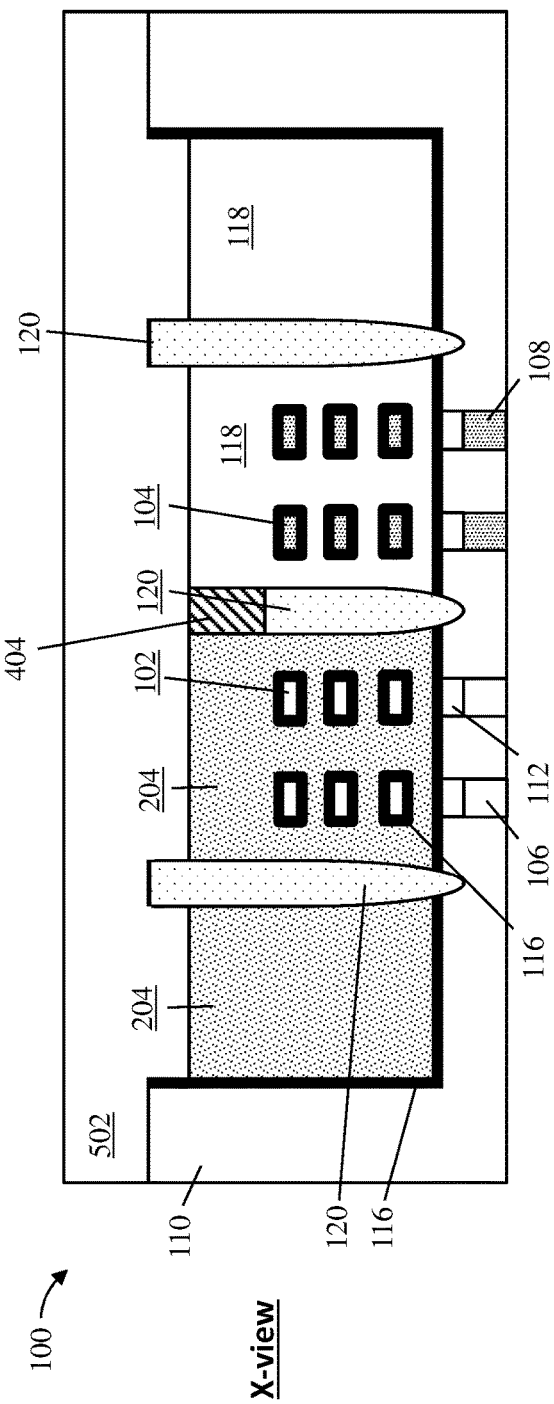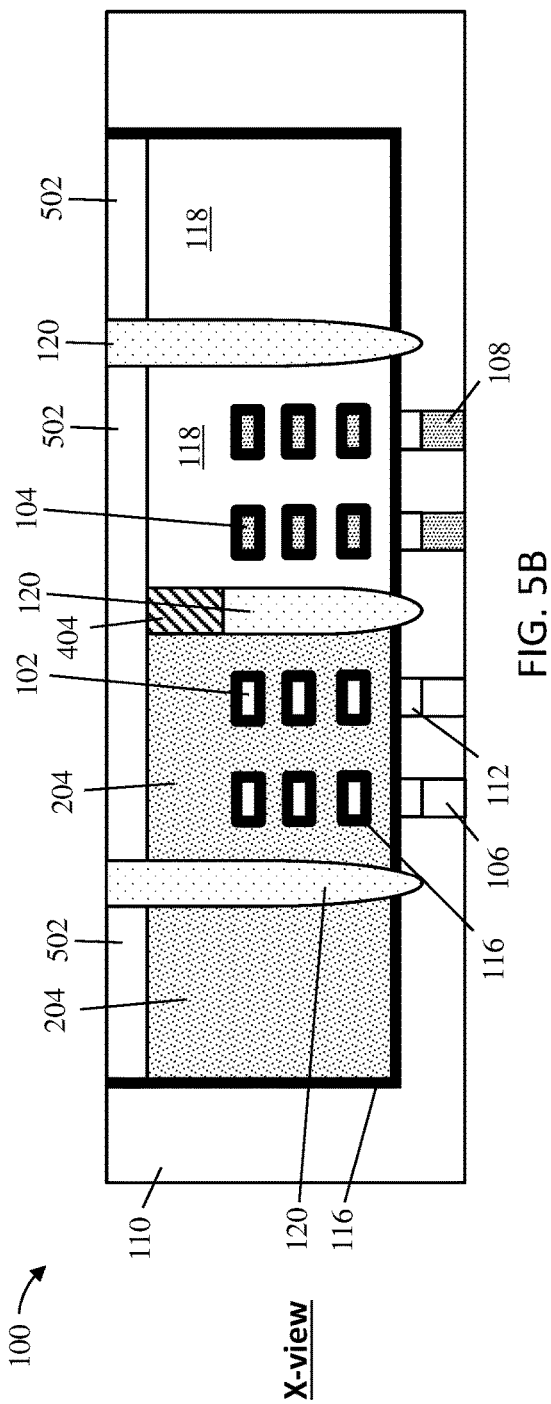

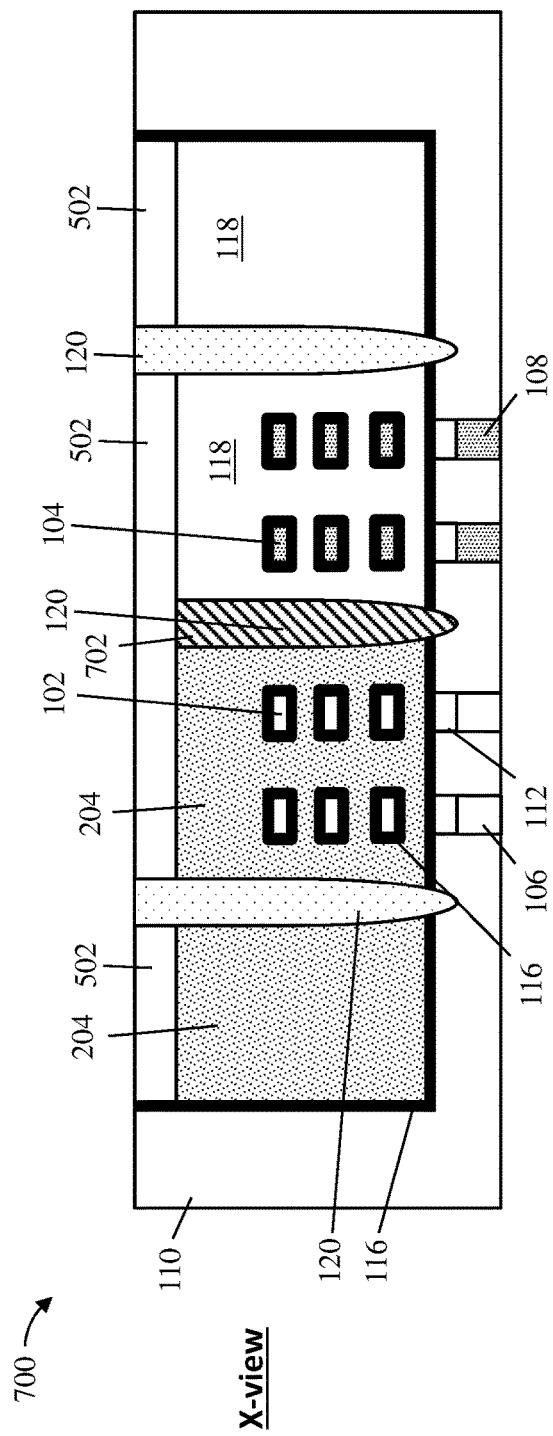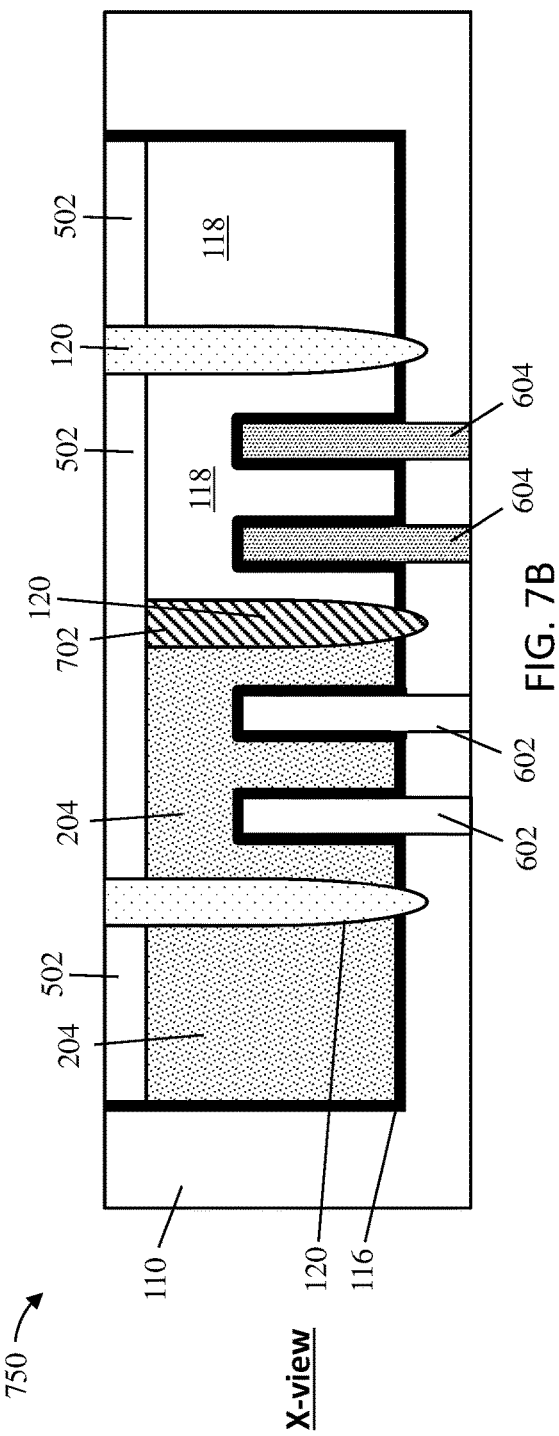

METAL GATE N/P BOUNDARY CONTROL BY ACTIVE GATE CUT AND RECESS

BACKGROUND

The present invention generally relates to fabrication methods and resulting structures for semiconductor devices, and more specifically, to fabrication methods and resulting structures that provide metal gate N/P boundary control using an active gate cut and recess.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, FinFETs and nanosheet FETs include a non-planar architecture that provides increased device density and some increased performance over lateral devices. In nanosheet FETs, in contrast to conventional planar FETs, the channel is implemented as a plurality of stacked and spaced apart nanosheets. The gate stack wraps around the full perimeter of each nanosheet, thus enabling fuller depletion in the channel region, and also reducing short-channel effects due to steeper subthreshold swing (SS) and smaller drain induced barrier lowering (DIBL).

SUMMARY

Embodiments of the invention are directed to a method of forming semiconductor devices on a wafer, wherein the method provides metal gate N/P boundary control using an active gate cut and recess processing scheme. A non-limiting example of the method includes forming a gate cut in an N/P boundary between an n-type field effect transistor (FET) and a p-type FET formed on the wafer. A first portion of a first work function metal is removed over a channel region of the n-type FET. The gate cut prevents etching a second portion of the first work function metal. The first portion of the first work function metal is replaced with a second work function metal. The gate cut is recessed, and a conductive region is formed on the recessed surface of the gate cut. The conductive divot provides electrical continuity across the N/P boundary.

Embodiments of the invention are directed to a method of forming semiconductor devices on a wafer, wherein the method provides metal gate N/P boundary control using an active gate cut and recess processing scheme. A non-limiting example of the method includes forming an n-type FET and a p-type FET on the wafer, wherein the n-type FET and the p-type FET are separated by an N/P boundary. A first work function metal is formed over channel regions of the p-type FET and a second work function metal is formed over channel regions of the n-type FET. A gate cut is placed in the N/P boundary between the first work function metal and the second work function metal. A surface of the gate cut is recessed to a height of the n-type FET, and a conductive region is formed on the recessed surface of the gate cut. The conductive divot provides electrical continuity across the N/P boundary.

Embodiments of the invention are directed to an integrated circuit (IC). A non-limiting example of the (IC) includes an n-type FET and a p-type FET separated by an N/P boundary. A first work function metal is positioned over channel regions of the p-type FET and a second work function metal is positioned over channel regions of the n-type FET. A gate cut is positioned in the N/P boundary between the first work function metal and the second work function metal. A surface of the gate cut is recessed to a height of the n-type FET. A conductive region is placed on the recessed surface of the gate cut. The conductive divot provides electrical continuity across the N/P boundary.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a cross-sectional view of an integrated circuit (IC) wafer during FEOL fabrication operations for forming nanosheet FETs on the wafer according to one or more embodiments of the invention;

FIG. 1B depicts a cross-sectional view of the IC wafer after a processing operation according to one or more embodiments of the invention;

FIG. 2A depicts a cross-sectional view of the IC wafer after a processing operation according to one or more embodiments of the invention;

FIG. 2B depicts a cross-sectional view of the IC wafer after a processing operation according to one or more embodiments of the invention;

FIG. 3A depicts an alternative cross-sectional view of the IC wafer according to one or more embodiments of the invention;

FIG. 3B depicts a cross-sectional view of the IC wafer after a processing operation according to one or more embodiments of the invention;

FIG. 4A depicts an alternative cross-sectional view of the IC wafer according to one or more embodiments of the invention;

FIG. 4B depicts a cross-sectional view of the IC wafer after a processing operation according to one or more embodiments of the invention;

FIG. 5A depicts an alternative cross-sectional view of the IC wafer according to one or more embodiments of the invention;

FIG. 5B depicts a cross-sectional view of the IC wafer after a processing operation according to one or more embodiments of the invention;

FIG. 7A depicts a cross-sectional view of an IC wafer during FEOL fabrication operations for forming nanosheet FETs on the wafer according to one or more embodiments of the invention;

FIG. 7B depicts a cross-sectional view of an IC wafer during FEOL fabrication operations for forming fin FETs on the wafer according to one or more embodiments of the invention;

Figure 6:
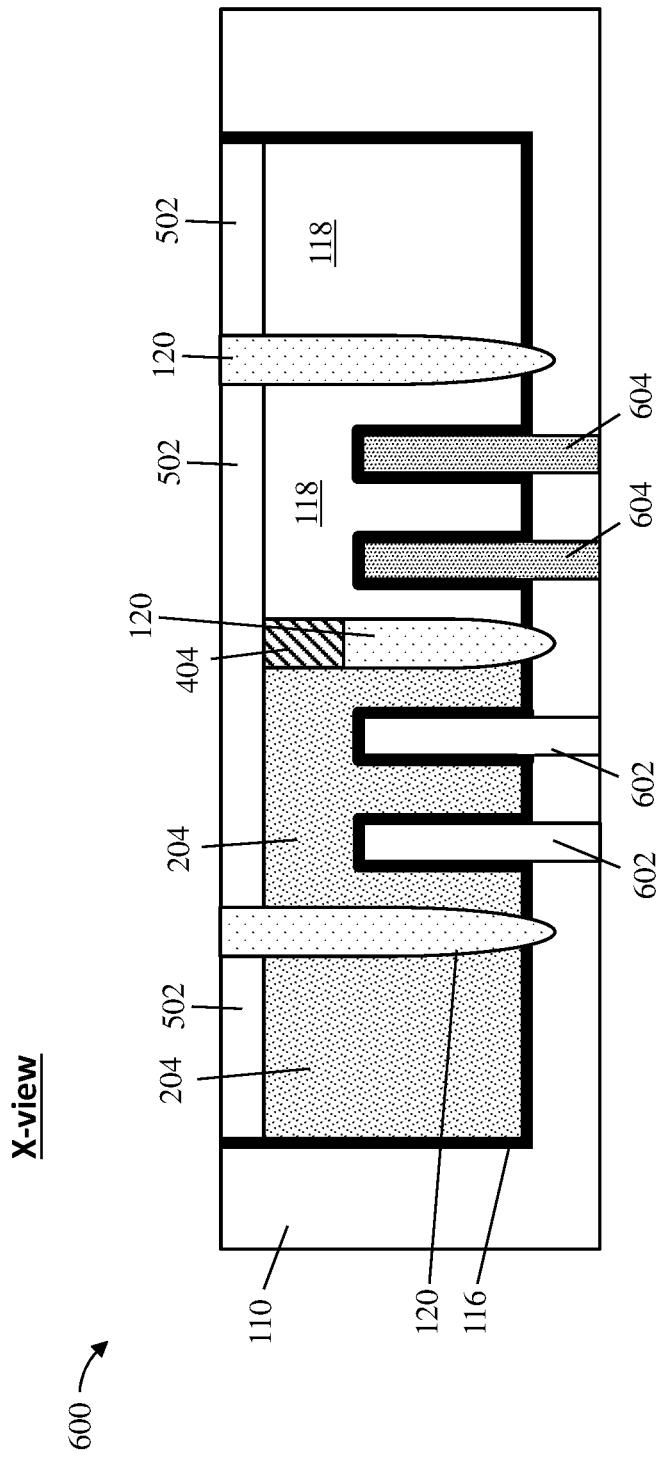
FIG. 6 depicts a cross-sectional view of an IC wafer during FEOL fabrication operations for forming fin FETs on the wafer according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

The present disclosure relates to providing metal gate N/P boundary control in an integrated circuit (IC) chip using an active gate cut and recess. While primarily discussed with respect to nanosheet field effect transistors (NS FETs), it is understood in advance that embodiments of the invention are not limited to the particular transistor architectures or materials described in this specification. Rather, embodiments of the present invention are capable of being implemented in conjunction with any other type of transistor architecture (e.g., FinFETs) using materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-20 layers (or more) are added in the BEOL process. The various BEOL layers are interconnected by vias that couple from one layer to another.

The continued scaling of semiconductor devices has resulted in challenging fabrication requirements, especially when fabricating ever smaller transistors. Advanced BEOL processes incorporate phase-shifting, optical proximity correction, and other practices to satisfy these scaling demands, and can achieve a line-to-line pitch below 30 nm. However, some challenges in fabricating advanced nonplanar transistors remain. For example, in highly scaled FinFET and nanosheet FET horizontal transport architectures control over tightly spaced N/P boundaries including work function metal (WFM) and threshold voltage (Vt) patterning, while necessary for scaling, is very difficult. This is especially true for nanosheet architectures, where the nanosheet width may be greater than or equal to the N/P boundary distance, causing undesirable removal of WFM from masked/blocked FETs.

Turning now to an overview of aspects of the present invention, one or more embodiments of the invention address the above-described shortcomings of the prior art by providing a new semiconductor structure and a method for providing metal gate N/P boundary control in an IC chip using an active gate cut and recess processing scheme. In some embodiments of the invention, a dielectric gate cut is inserted at the N/P boundary prior to work function metal (WFM) patterning. The WFM can then be removed from one side of the N/P boundary without worrying about overetching (i.e., inadvertently removing some of the WFM from the other side). The dielectric gate cut can be recessed (or wholly removed) and partially replaced (or wholly replaced) with conductive material to provide a continuously conductive N/P gate.

Advantageously, the dielectric gate cut can be recessed to any height desired, allowing for the recess to be tuned for a given application. For example, for the FinFET case, an ideal dielectric gate cut height in an active shared gate region is at the same or substantially the same (i.e., within 3-5 nanometers) height as fins. This ensures that threshold voltage (Vt) is not severely affected, but also ensures that gate conductivity is not overly reduced. For the nanosheet case, however, recessing the dielectric gate cut height to the same or substantially the same (i.e., within 3-5 nanometers) height as the top sheet reduces gate conductivity to a greater extent than in the FinFET case. For these applications, full removal (and replacement) of the dielectric gate cut from active gate regions can be utilized.

Turning now to a more detailed description of aspects of the present invention, FIGS. 1A-9 depict cross-sectional views of a FEOL region of IC wafers 100, 600, 700, 800, 900 after fabrication operations in accordance with aspects of the invention. Although the cross-sectional diagrams depicted in FIGS. 1A-9 are two-dimensional, it is understood that the diagrams depicted in FIGS. 1A-9 represent three-dimensional structures. To assist with visualizing the three-dimensional features, the top-down reference diagram 101 shown in FIG. 1A provides a reference point for the four cross-sectional views (X-view) shown in FIGS. 1A-9. The X-view depicts a side cross-sectional view taken across the channel regions of the FETs (whether nanosheet FETs or Fin FETs).

FIG. 1A depicts a cross-sectional view of a FEOL region of an IC wafer 100 during FEOL fabrication operations for forming nanosheet FETs on the IC wafer 100 according to one or more embodiments of the invention. At the fabrication stage depicted in FIG. 1A, known fabrication operations have been used to form one or more vertically stacked n-type nanosheets 102 and one or more vertically stacked p-type nanosheets 104 over a substrate (not separately shown) having an n-type region 106 and a p-type region 108. In some embodiments of the invention, the n-type nanosheets 102 are formed adjacent to the p-type nanosheets 104. In some embodiments of the invention, the space between the n-type nanosheets 102 and the p-type nanosheets 104 defines an N/P boundary. While generally depicted with nanosheets for ease of discussion, it is understood that the present processing operations can be applied to other transistor architectures, such as FinFETs. Moreover, for ease of discussion reference is made to operations performed on and to nanosheet stacks have 3 vertically stacked nanosheets (e.g., the two sets of 3 vertically stacked n-type nanosheets 102 shown in FIG. 1A). It is understood, however, that the nanosheet stacks can include any number of nanosheets. For example, the nanosheet stacks can include two nanosheets, five nanosheets, eight nanosheets, 30 nanosheets (e.g., 3D NAND), or any number of nanosheets. Finally, while generally discussed with respect to the FEOL region for ease of discussion, the completed IC wafer 100 will include BEOL and MOL structures (not shown).

The n-type nanosheets 102 and p-type nanosheets 104 can be made of any suitable semiconductor material such as, for example, monocrystalline silicon or silicon germanium. In some embodiments of the invention, the n-type nanosheets 102 and p-type nanosheets 104 have a thickness of about 4 nm to about 10 nm, for example 6 nm, although other thicknesses are within the contemplated scope of the invention. In some embodiments of the invention, the n-type nanosheets 102 and p-type nanosheets 104 are made of a same semiconductor material that is then doped with n-type dopants or p-type dopants, respectively. In other embodiments of the invention, the n-type nanosheets 102 and p-type nanosheets 104 can be made of different semiconductor materials (e.g., silicon and silicon germanium).

The substrate (n-type region 106 and p-type region 108) can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. In some embodiments of the invention, the n-type region 106 is doped with n-type dopants, while the p-type region 108 is doped with p-type dopants.

In some embodiments of the invention, a buried oxide layer (not shown) is provided in a silicon-on-insulator (SOI) configuration. The buried oxide layer can be made of any suitable dielectric material, such as, for example, a silicon oxide. In some embodiments of the invention, the buried oxide layer is formed to a thickness of about 10-200 nm, although other thicknesses are within the contemplated scope of the invention. In some embodiments of the invention, the IC wafer 100 can be formed without a buried oxide layer. In that case, the shallow trench isolation (STI) 110 is configured to isolate the n-type nanosheets 102 and p-type nanosheets 104 from other active devices on the IC wafer 100. The STI 110 can include any suitable dielectric material, such as, for example, silicon oxide. In some embodiments of the invention, further isolation (local isolation) is provided by a bottom dielectric isolation (BDI) region 112 positioned between the regions 106, 108 and a gate 114.

In some embodiments of the invention, the gate 114 can be a high-k metal gate (HKMG) formed over channel regions of the n-type nanosheets 102 and p-type nanosheets 104. As used herein, a "channel region" refers to the respective portion of the n-type nanosheets 102 and p-type nanosheets 104 over which the gate 114 is formed, and through which a current passes from source to drain in the final device. In some embodiments of the invention, the gate 114 is a replacement metal gate (RMG, HK RMG) formed in a gate last process integration (as shown). In some embodiments of the invention, the gate 114 includes a gate dielectric 116 and a work function metal stack 118 (WFM 118), configured and arranged as shown.

In some embodiments of the invention, the gate dielectric 116 is a high-k dielectric film (materials having a high dielectric constant relative to silicon dioxide, i.e., more than 3.9). High-k dielectric materials can include, for example, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the gate dielectric 116 can have a thickness of about 0.5 nm to about 4 nm, although other thicknesses are within the contemplated scope of the disclosure.

In some embodiments of the invention, the WFM 118 includes one or more work function layers made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The WFM 118 can serve to modify the work function of the gate 114 and enables tuning of the device threshold voltage. In some embodiments of the invention, the WFM 118 includes a p-type WFM, such as, for example, TiN.

FIG. 1B depicts a cross-sectional view of the IC wafer 100 after a processing operation according to one or more embodiments of the invention. In some embodiments of the invention, one or more gate cuts 120 are formed in the WFM 118. In some embodiments of the invention, the gate cuts 120 are formed by removing portions of the WFM 118 using known processes, such as using a wet etch, a dry etch, or a combination of sequential wet and/or dry etches and replacing the removed portions of the WFM 118 with dielectric material. In some embodiments of the invention, the gate cuts 120 partially recess into the STI 110 (as shown).

In some embodiments of the invention, the gate cuts 120 include dielectric materials that can be etched selective to the STI 110, gate dielectric 116, and/or WFM 118 (e.g., selective to SiN, HDP SiO2, the selected gate metal, etc.). Example materials include flowable SiO2, AlN, Al2O3, etc. If no suitable materials can be found, a sacrificial material can be used instead. The sacrificial material can be replaced post self-aligned cap (SAC) planarization (see, e.g., FIG. 8A). In some embodiments of the invention, the gate cuts 120 are formed in the WFM 118 after depositing the gate dielectric 116 (i.e., gate cuts can be done in RMG). In this manner, the gate dielectric 116 cannot coat the sidewalls of the gate cuts 120, improving downstream integration.

FIG. 2A depicts a cross-sectional view of the IC wafer 100 after a processing operation according to one or more embodiments of the invention. In some embodiments of the invention, a hard mask 202 (also referred to as a block) is placed over the IC wafer 100 and opened to expose the portion of the WFM 118 over the n-type nanosheets 102. The exposed portions of the WFM 118 can then be removed using known processes, such as a wet etch, a dry etch, or a combination of sequential wet and/or dry etches. This process can be referred to as nFET patterning. In some embodiments of the invention, the WFM 118 is removed selective to the gate cuts 120 and/or the gate dielectric 116.

Advantageously, placing the gate cuts 120 as described (at the N/P boundary for each gate) gives flexibility to over-etch as much as desired during this process without worrying about inadvertently etching the WFM 118 over the p-type nanosheets 104. For example, over-etching can be employed to completely remove the WFM 118 from arbitrarily tight spaces, such as between vertically stacked nanosheets. Notably, full removal is possible even for nanosheet/fin widths that approach or exceed the N/P boundary distance (e.g., where fin or nanosheet width≥N/P boundary distance).

FIG. 2B depicts a cross-sectional view of the IC wafer 100 after a processing operation according to one or more embodiments of the invention. In some embodiments of the invention, the hard mask 202 is removed and a WFM 204 is formed over the n-type nanosheets 102. In some embodiments of the invention, the WFM 204 includes an overburden above the WFM 118 (as shown).

In some embodiments of the invention, the WFM 204 includes one or more work function layers made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. In some embodiments of the invention, the WFM 204 includes an n-type WFM, such as, for example, TiAlC.

In some embodiments of the invention, a conductive fill layer 206 is formed over the WFM 204. The conductive fill layer 206 can be made of any suitable conductive material, such as, for example, tungsten. The conductive fill layer 206 serves as a planarizing layer for a subsequent chemical-mechanical planarization (CMP) process (see FIG. 3A).

FIG. 3A depicts a cross-sectional view of the IC wafer 100 after a processing operation according to one or more embodiments of the invention. In some embodiments of the invention, the IC wafer 100 is planarized using, for example, CMP. In some embodiments of the invention, the CMP is progressed until top surfaces of the gate cuts 120 are exposed.

FIG. 3B depicts a cross-sectional view of the IC wafer 100 after a processing operation according to one or more embodiments of the invention. In some embodiments of the invention, a mask (not separately shown) is formed over the IC wafer 100 and opened to expose one or more gate cuts of the gate cuts 120. In some embodiments of the invention, gate cuts in one or more active gate regions (e.g., at the N/P boundary) of the IC wafer 100 are opened.

Once exposed, the gate cuts 120 can be recessed using known processes, such as a wet etch, a dry etch, or a combination of sequential wet and/or dry etches. As discussed previously, one or more of the gate cuts 120 can be recessed to any height desired. As shown, one or more of the gate cuts 120 can be recessed to a top sheet of the n-type nanosheets 102 and/or the p-type nanosheets 104. Other recess depths, including full removal, are possible (see, e.g., FIG. 7A).

FIG. 4A depicts a cross-sectional view of the IC wafer 100 after a processing operation according to one or more embodiments of the invention. In some embodiments of the invention, a conductive layer 402 is formed over the WFMs 118, 204 and gate cuts 120. In this manner, the conductive layer 402 serves as a conductive backfill that provides electrical continuity across the WFMs 118, 204 (enabling, e.g., a continuously conducting N/P gate).

The conductive layer 402 can be made of any suitable gate metal, such as, for example, tungsten, titanium, tantalum, ruthenium, zirconium, cobalt, copper, aluminum, lead, platinum, tin, silver, gold, conducting metallic compound materials (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. In some embodiments of the invention, the conductive layer 402 includes TiN or a TiN/TiALC stack (bilayer). In some embodiments of the invention, the conductive layer 402 includes a TiN/TiCAl/TiN stack (trilayer).

As discussed previously, in some embodiments of the invention, the gate cuts 120 are formed after depositing the gate dielectric 116 (i.e., gate cuts can be done in RMG). In this manner, the gate dielectric 116 cannot coat the sidewalls of the gate cuts 120. Notably, this also prevents portions of the gate dielectric 116 from forming between the conductive layer 402 and the sidewalls of the WFMs 118, 204, which would break electrical continuity across the N/P boundary. In other words, if the gate cuts 120 were formed prior to the gate dielectric 116 (e.g., if done in POC), portions of the gate dielectric 116 would line the sidewalls of the gate cuts 120. These layers would need to be removed before forming the conductive layer 402, as otherwise the dielectric material would insulate the conductive layer 402 from the adjacent gate metal. In some embodiments of the invention, a gate cut mask design can be leveraged to provide a gate cut offset (not shown) in either direction between the n-type nanosheets or fins (sometimes referred to as "RX_n") and the p-type nanosheets or fins (sometimes referred to as "RX_p"), to determine Vt effect of placement of the conductive layer 402.

FIG. 4B depicts a cross-sectional view of the IC wafer 100 after a processing operation according to one or more embodiments of the invention. In some embodiments of the invention, the conductive layer 402 and the WFMs 118, 204 are recessed below a topmost surface of the gate cuts 120. In some embodiments of the invention, the conductive layer 402 and the WFMs 118, 204 are recessed selective to the gate cuts 120. Remaining portions of the conductive layer 402 define a divot (or conductive region) 404. In some embodiments of the invention, the divot 404 will include seams 406 (sometimes referred to as metal seams) at the metal boundaries (i.e., at the boundary between the divot 404 and the WFM 118, and at the boundary between the divot 404 and the WFM 204). In some embodiments of the invention, the divot 404 will include an internal seam (not separately shown) along the centerline if, for example, ALD deposition is used. These seams are observable in the final device.

FIG. 5A depicts a cross-sectional view of the IC wafer 100 after a processing operation according to one or more embodiments of the invention. In some embodiments of the invention, a dielectric cap 502 is formed over the IC wafer 100. The dielectric cap 502 can be made of any suitable dielectric material, such as, for example, SiN. In some embodiments of the invention, the dielectric cap 502 is a self-aligned cap (SAC).

FIG. 5B depicts a cross-sectional view of the IC wafer 100 after a processing operation according to one or more embodiments of the invention. In some embodiments of the invention, the dielectric cap 502 is planarized to a surface of the gate cuts 120. The dielectric cap 502 can be planarized using known processes, such as, for example, CMP. In some embodiments of the invention, the distance between the sidewall of the centermost gate cut and the sidewall of the nearest nanosheet is about 15 to 35 nm, for example, 25 nm.

FIG. 6 depicts a cross-sectional view of a FEOL region of an IC wafer 600 during FEOL fabrication operations for forming FinFETs on the IC wafer 600 according to one or more embodiments of the invention. At the fabrication stage depicted in FIG. 6, previously described fabrication operations have been used to form one or more n-type fins 602, one or more p-type fins 104, gate cuts 120, and a divot 404. The IC wafer 600 is formed in a same manner as the IC wafer 100 discussed with respect to FIGS. 1A-5B, except that the IC wafer 600 includes n-type fins 602 and p-type fins 604 instead of the n-type nanosheets 102 and p-type nanosheets 104.

FIG. 7A depicts a cross-sectional view of a FEOL region of an IC wafer 700 during FEOL fabrication operations for forming nanosheet FETs on the IC wafer 700 according to one or more embodiments of the invention. The IC wafer 700 is formed in a same manner as the IC wafer 100 discussed with respect to FIGS. 1A-5B, except that in the IC wafer 700 one or more of the gate cuts 120 are fully removed (instead of partially recessed) and replaced with a full-size divot 702.

FIG. 7B depicts a cross-sectional view of a FEOL region of an IC wafer 750 during FEOL fabrication operations for forming FinFETs on the IC wafer 750 according to one or more embodiments of the invention. The IC wafer 750 is formed in a same manner as the IC wafer 600 discussed with respect to FIG. 5, except that in the IC wafer 750 one or more of the gate cuts 120 are fully removed (instead of partially recessed) and replaced with a full-size divot 702.

Figure 8A:
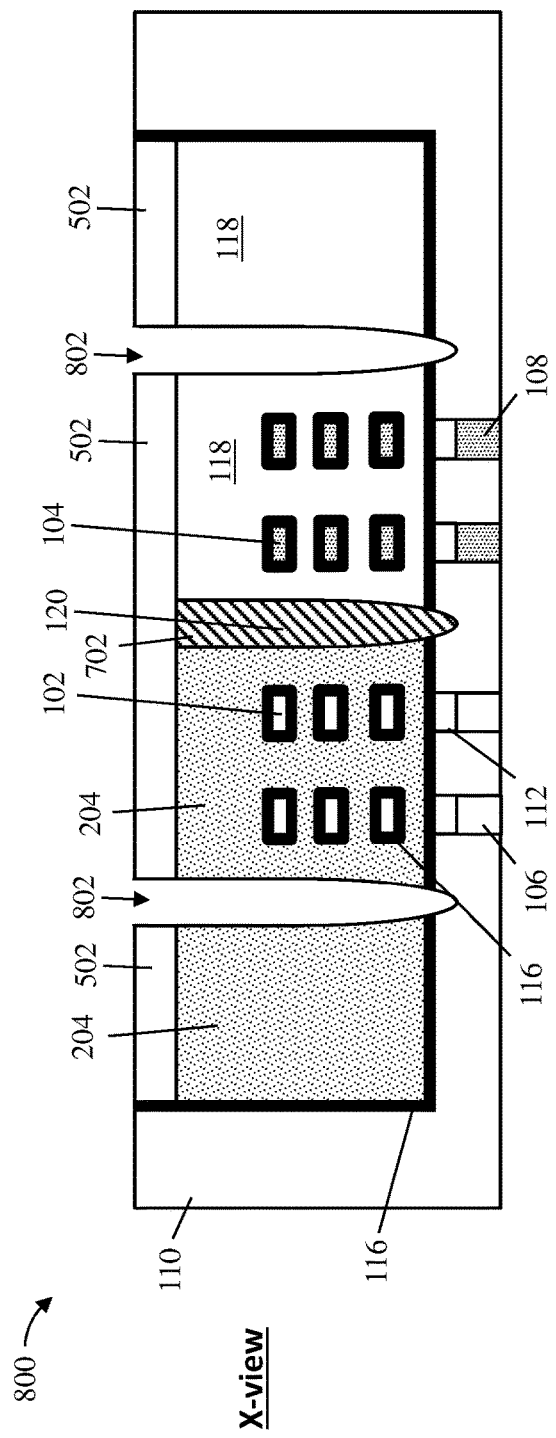
FIG. 8A depicts a cross-sectional view of an IC wafer during FEOL fabrication operations for forming nanosheet FETs on the wafer according to one or more embodiments of the invention.

FIG. 8A depicts a cross-sectional view of a FEOL region of an IC wafer 800 during FEOL fabrication operations for forming nanosheet FETs on the IC wafer 800 according to one or more embodiments of the invention. The IC wafer 800 is formed in a same manner as the IC wafer 700 discussed with respect to FIG. 7A (i.e., with full-size divots), except that in the IC wafer 800 one or more of the gate cuts 120 are sacrificial gate cuts that are removed to define trenches 802. In some embodiments of the invention, the sacrificial gate cuts (not separately shown) are removed after planarizing the dielectric cap 502 (i.e., after SAC CMP).

Figure 8B:
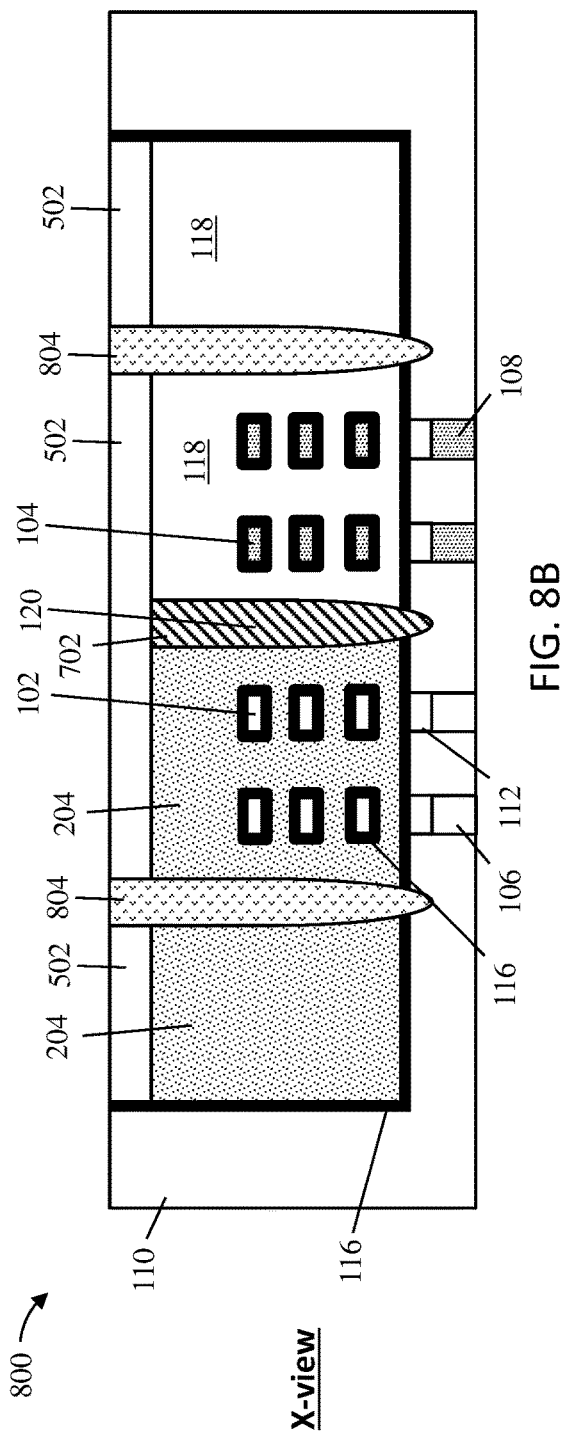
FIG. 8B depicts a cross-sectional view of the IC wafer after a processing operation according to one or more embodiments of the invention.

FIG. 8B depicts a cross-sectional view of the IC wafer 800 after a processing operation according to one or more embodiments of the invention. In some embodiments of the invention, the trenches 802 are filled with dielectric material to define one or more permanent gate cuts 804. The gate cuts 804 can be made of any suitable dielectric material, as they are not subjected to any of the processing conditions prior to SAC CMP, such as, for example, silicon nitride.

Figure 9:
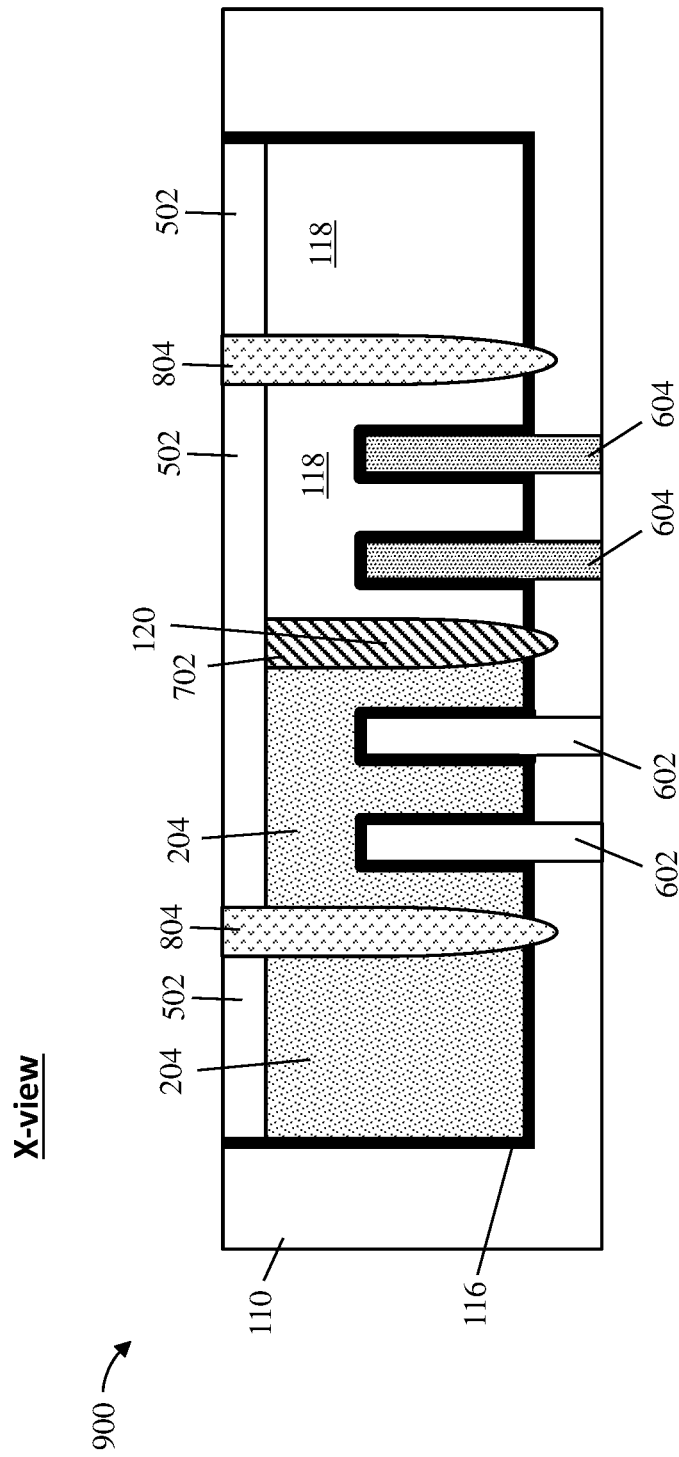
FIG. 9 depicts a cross-sectional view of an IC wafer during FEOL fabrication operations for forming fin FETs on the wafer according to one or more embodiments of the invention.

FIG. 9 depicts a cross-sectional view of a FEOL region of an IC wafer 900 during FEOL fabrication operations for forming FinFETs on the IC wafer 900 according to one or more embodiments of the invention. The IC wafer 900 is formed in a same manner as the IC wafer 800 discussed with respect to FIGS. 8A and 8B (i.e., with full-size divots and sacrificial gate cuts), except that the IC wafer 900 includes n-type fins 602 and p-type fins 604 instead of the n-type nanosheets 102 and p-type nanosheets 104.

Figure 10:
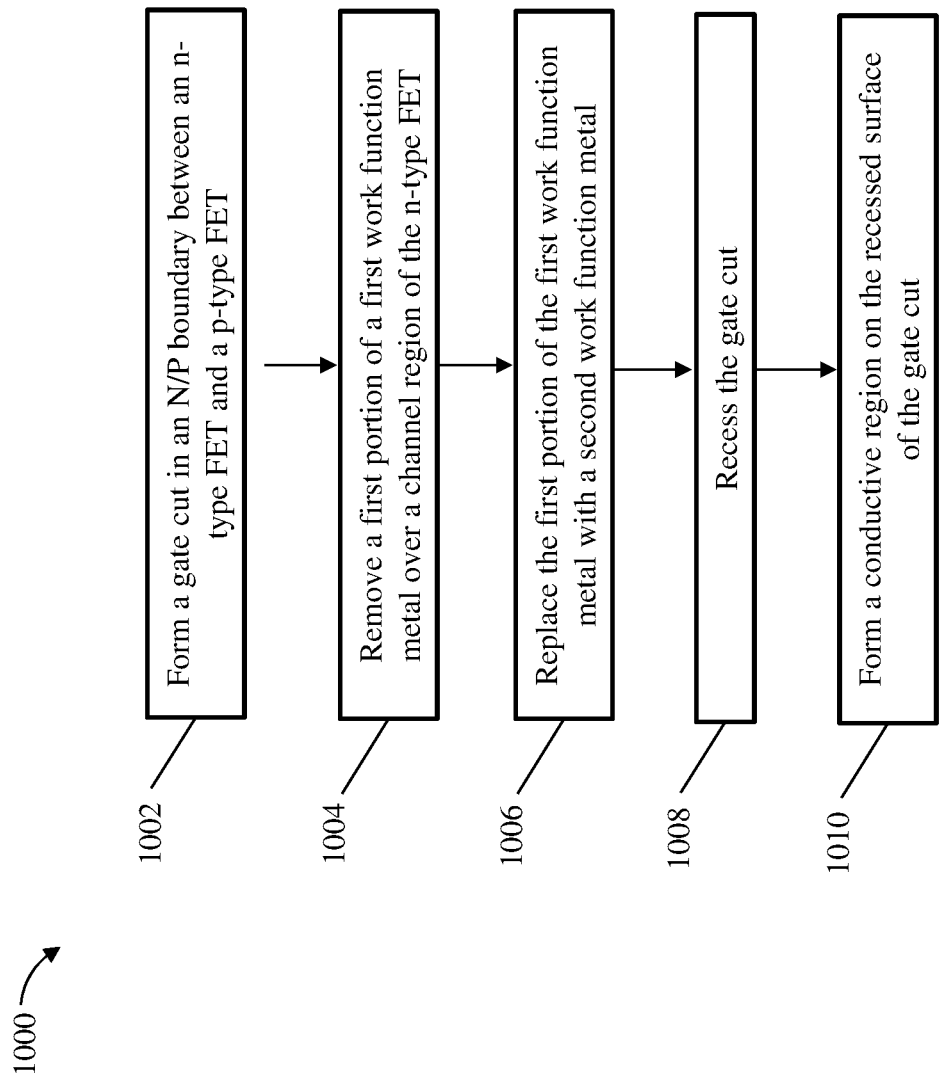
FIG. 10 depicts a flow diagram illustrating a method according to one or more embodiments of the invention.

FIG. 10 depicts a flow diagram 1000 illustrating a method for providing metal gate N/P boundary control in an IC chip using an active gate cut and recess processing scheme according to one or more embodiments of the invention. As shown at block 1002, a gate cut is formed in an N/P boundary between an n-type FET and a p-type FET. In some embodiments of the invention, the gate cut partially recesses into an isolation region below the n-type FET and the p-type FET. In some embodiments of the invention, the n-type FET is an n-type nanosheet and the p-type FET is a p-type nanosheet. In some embodiments of the invention, the n-type FET is an n-type fin FET and the p-type FET is a p-type fin FET.

At block 1004, a first portion of a first work function metal is removed over a channel region of the n-type FET. In some embodiments of the invention, the gate cut prevents etching a second portion of the first work function metal.

At block 1006, the first portion of the first work function metal is replaced with a second work function metal. In some embodiments of the invention, the first work function metal is a p-type work function metal and the second work function metal is an n-type work function metal.

At block 1008, the gate cut is recessed. In some embodiments of the invention, the gate cut is recessed to a top surface of the n-type FET. In some embodiments of the invention, the gate cut is recessed to a top surface of the p-type FET. In some embodiments of the invention, the gate cut is completely removed and replaced by a conductive region (divot).

At block 1010, a conductive region (conductive divot) is formed on the recessed surface of the gate cut. In some embodiments of the invention, the conductive region provides electrical continuity across the N/P boundary.

In some embodiments of the invention, the gate cut is a sacrificial material that is later replaced with a dielectric material. In some embodiments of the invention, the sacrificial gate cut is replaced after forming a self-aligned cap (SAC) over the first work function metal and second work function metal.

Figure 11:
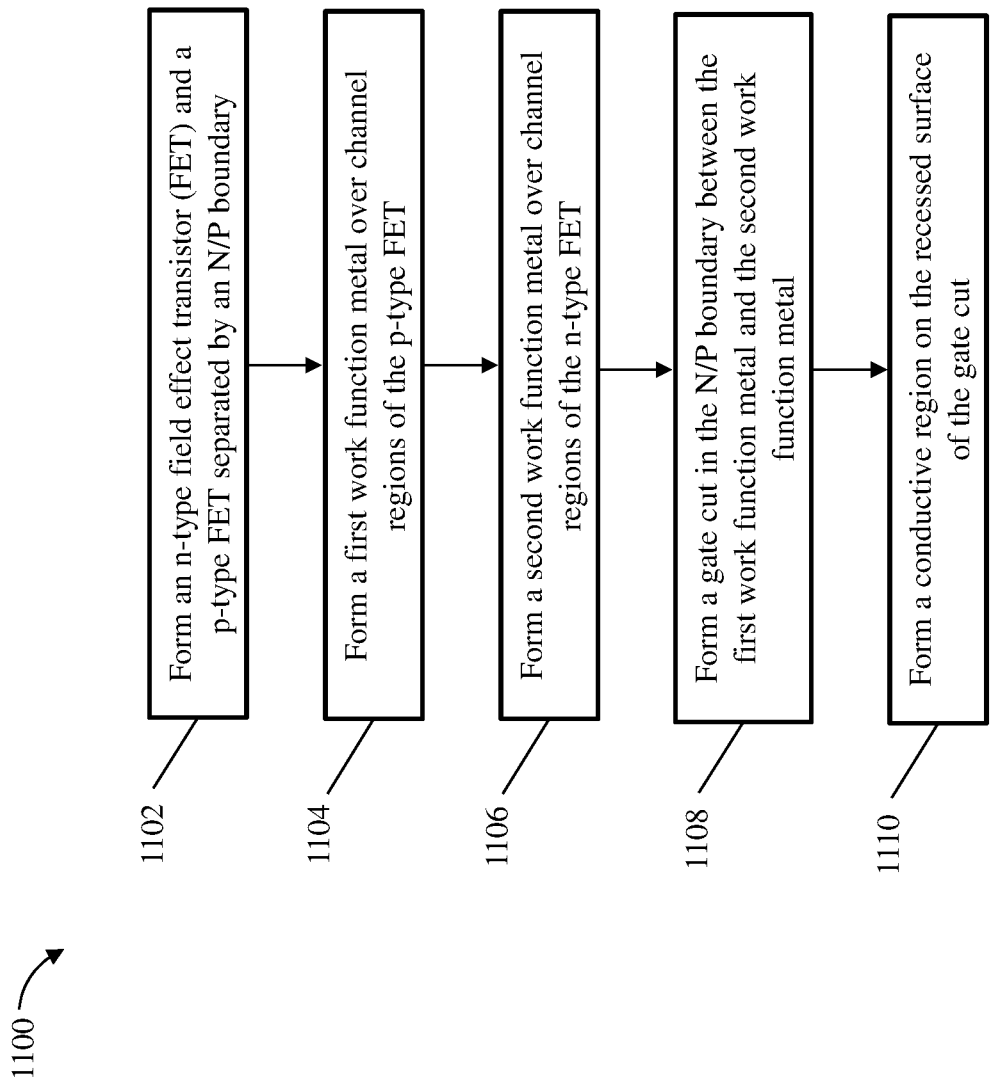
FIG. 11 depicts a flow diagram illustrating a method according to one or more embodiments of the invention.

FIG. 11 depicts a flow diagram 1100 illustrating a method for providing metal gate N/P boundary control in an IC chip using an active gate cut and recess processing scheme according to one or more embodiments of the invention. As shown at block 1102, the method includes forming an n-type FET and a p-type FET separated by an N/P boundary.

At block 1104, a first work function metal is formed over channel regions of the p-type FET. At block 1106, a second work function metal is formed over channel regions of the n-type FET.

At block 1108, a gate cut is formed in the N/P boundary between the first work function metal and the second work function metal. In some embodiments of the invention, a surface of the gate cut is recessed to a height of the n-type FET and/or the p-type FET.

At block 1110, a conductive region (conductive divot) is formed on the recessed surface of the gate cut. In some embodiments of the invention, the conductive region provides electrical continuity across the N/P boundary.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit comprising:
   an n-type field effect transistor (FET) and a p-type FET separated by an N/P boundary;
   a first work function metal over channel regions of the p-type FET;
   a second work function metal over channel regions of the n-type FET;
   a first gate cut in the N/P boundary between the first work function metal and the second work function metal, wherein a surface of the first gate cut is recessed below a surface of the first work function metal;

a conductive region on the recessed surface of the first gate cut, wherein the conductive region provides electrical continuity across the N/P boundary; and a second gate cut on an opposite end of at least one of the n-type FET and the p-type FET, wherein a topmost surface of the conductive region on the recessed surface of the first gate cut is recessed with respect to a topmost surface of the second gate cut.

2. The integrated circuit of claim 1, wherein the surface of the first gate cut is recessed to a height of at least one of the n-type FET and the p-type FET.

3. The integrated circuit of claim 1, wherein the first gate cut partially recesses into an isolation region below the n-type FET and the p-type FET.

4. The integrated circuit of claim 1, wherein the n-type FET comprises an n-type nanosheet and the p-type FET comprises a p-type nanosheet.

5. The integrated circuit of claim 1, wherein the n-type FET comprises an n-type fin FET and the p-type FET comprises a p-type fin FET.

6. The integrated circuit of claim 1, wherein the first work function metal comprises a p-type work function metal and the second work function metal comprises an n-type work function metal.

7. The integrated circuit of claim 1 further comprising:
a first seam between the conductive region and the first work function metal; and
a second seam between the conductive region and the second work function metal.

8. The integrated circuit of claim 7 further comprising a third seam along a centerline of the conductive region.

9. An integrated circuit comprising:
an n-type field effect transistor (FET) and a p-type FET separated by an N/P boundary;
a first work function metal over channel regions of the p-type FET;
a second work function metal over channel regions of the n-type FET; and
a conductive region in the N/P boundary between the first work function metal and the second work function metal, wherein the conductive region provides electrical continuity across the N/P boundary, wherein the conductive region partially recesses into an isolation region below the n-type FET and the p-type FET.

10. The integrated circuit of claim 9, wherein the n-type FET comprises an n-type nanosheet and the p-type FET comprises a p-type nanosheet.

11. The integrated circuit of claim 9, wherein the n-type FET comprises an n-type fin FET and the p-type FET comprises a p-type fin FET.

12. The integrated circuit of claim 9, wherein the first work function metal comprises a p-type work function metal and the second work function metal comprises an n-type work function metal.

13. The integrated circuit of claim 9 further comprising:
a first seam between the conductive region and the first work function metal; and
a second seam between the conductive region and the second work function metal.

14. The integrated circuit of claim 13 further comprising a third seam along a centerline of the conductive region.

15. A method for forming an integrated circuit, the method comprising:
forming a gate cut in an N/P boundary between an n-type field effect transistor (FET) and a p-type FET;
removing a first portion of a first work function metal over a channel region of the n-type FET, wherein the gate cut prevents etching a second portion of the first work function metal;
replacing the first portion of the first work function metal with a second work function metal;
completely removing the gate cut; and
replacing the gate cut with a conductive region, wherein the conductive region provides electrical continuity across the N/P boundary.

16. The method of claim 15, wherein the gate cut partially recesses into an isolation region below the n-type FET and the p-type FET.

17. The method of claim 15, wherein the gate cut is recessed to a top surface of the n-type FET.

18. The method of claim 15, wherein the gate cut comprises a sacrificial material that is replaced with a dielectric material after forming a self-aligned cap (SAC) over the first work function metal and second work function metal.

* * * * *